US007506298B1

(12) United States Patent
Ingoldby et al.

(10) Patent No.: US 7,506,298 B1
(45) Date of Patent: Mar. 17, 2009

(54) METHODS OF MAPPING A LOGICAL MEMORY REPRESENTATION TO PHYSICAL MEMORY IN A PROGRAMMABLE LOGIC DEVICE

(75) Inventors: Michael George Ingoldby, Boulder, CO (US); James E. Ogden, San Jose, CA (US); Stacey Secatch, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 230 days.

(21) Appl. No.: 11/642,173

(22) Filed: Dec. 19, 2006

(51) Int. Cl.
*G06F 17/50* (2006.01)
(52) U.S. Cl. .......................... 716/18; 716/16
(58) Field of Classification Search .............. 716/16, 716/18
See application file for complete search history.

(56) References Cited

U.S. PATENT DOCUMENTS

| | | | | |
|---|---|---|---|---|
| 5,550,843 A * | 8/1996 | Yee | ............................ | 714/726 |
| 5,675,589 A * | 10/1997 | Yee | ............................ | 714/30 |
| 6,530,073 B2 * | 3/2003 | Morgan | ........................ | 716/18 |
| 6,539,535 B2 * | 3/2003 | Butts et al. | ..................... | 716/17 |
| 6,550,042 B1 * | 4/2003 | Dave | .............................. | 716/5 |
| 6,803,782 B2 * | 10/2004 | Koob et al. | ..................... | 326/10 |
| 6,877,150 B1 * | 4/2005 | Miller et al. | ................... | 716/18 |
| 7,120,883 B1 * | 10/2006 | van Antwerpen et al. | ........ | 716/6 |
| 7,143,388 B1 * | 11/2006 | Miller et al. | ................... | 716/18 |
| 7,197,438 B1 * | 3/2007 | Mehta et al. | .................... | 703/2 |
| 7,200,786 B2 * | 4/2007 | Cheng et al. | ................. | 714/733 |
| 2002/0162084 A1 * | 10/2002 | Butts et al. | ..................... | 716/17 |
| 2002/0162086 A1 * | 10/2002 | Morgan | ........................ | 716/18 |
| 2003/0154458 A1 * | 8/2003 | Butts et al. | ..................... | 716/17 |
| 2005/0235232 A1 * | 10/2005 | Papanikolaou et al. | ......... | 716/1 |

FOREIGN PATENT DOCUMENTS

| | | | |
|---|---|---|---|
| JP | 03070052 A | * | 3/1991 |
| JP | 2000222883 A | * | 8/2000 |

OTHER PUBLICATIONS

Evans (Automated English translation of Japanese Patent Document No. JP-2000222883-A, machine translated on Sep. 30, 2008, pp. 1-9).*
Xilinx, Inc.; "Virtex-4 User Guide"; Version v1.5; published Mar. 21, 2006; available from Xilinx, Inc.; 2100 Logic Drive, San Jose, California 95124; pp. 109-161.
Xilinx, Inc.; U.S. Appl. No. 11/450,222, filed Jun. 9, 2006 by Ward et al.
Russell Tessier et al.; "Power-aware RAM Mapping for FPGA Embedded Memory Blocks"; FPGA '06; Feb. 22-24, 2006; Copyright 2006 ACM; pp. 1-10.

* cited by examiner

*Primary Examiner*—Phallaka Kik
(74) *Attorney, Agent, or Firm*—Lois D. Cartier; LeRoy D. Maunu

(57) ABSTRACT

Computer-implemented methods of mapping a logical representation of a memory to physical memory, e.g., in a programmable logic device (PLD). The logical representation of the memory is input into the computer, which generates an initial solution (e.g., a column-based solution) for the memory. In a column-based solution, the primitives are arranged such that each column includes only one type of primitive. The column-based solution generated in this step uses the minimum number of primitives attainable by a column-based approach. The column-based solution is then modified to reduce multiplexing, e.g., by replacing two primitives that are cascaded in depth with two primitives that are cascaded in width. In some embodiments, the total number of primitives can be reduced by the modification. The resulting physical representation of the memory is then output, and can be utilized, if desired, to create an implementation of the memory targeted to a PLD.

17 Claims, 8 Drawing Sheets

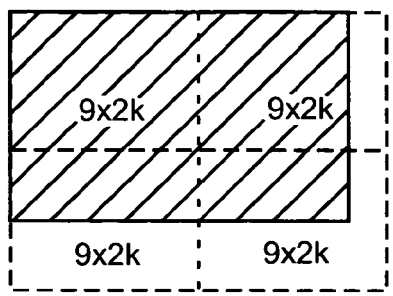
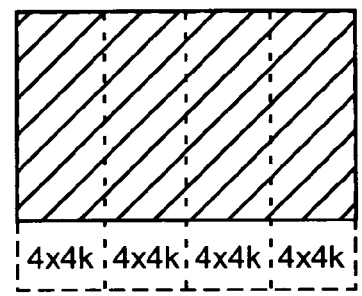
FIG. 7          FIG. 8
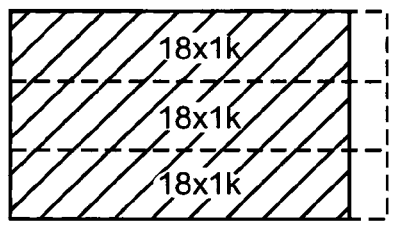
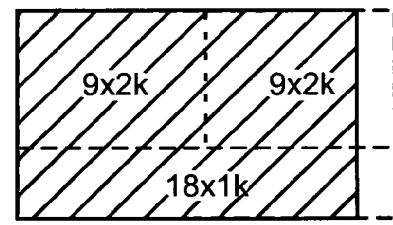
FIG. 9          FIG. 10
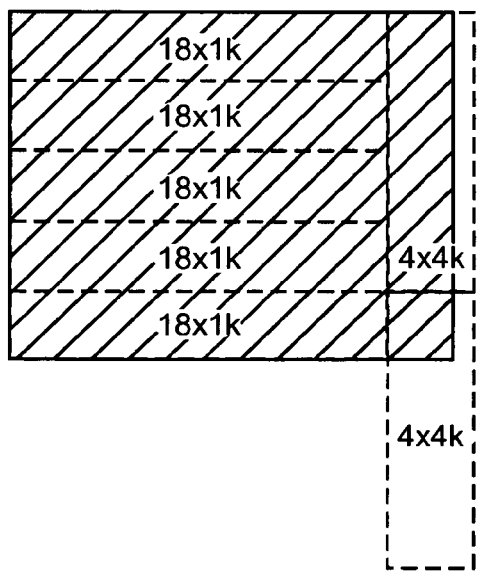
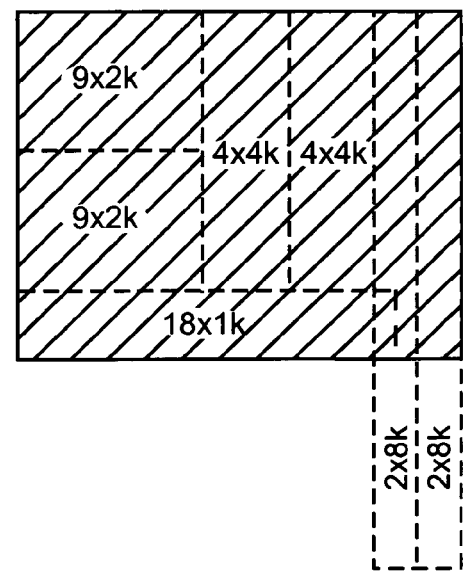
FIG. 11         FIG. 12

METHODS OF MAPPING A LOGICAL MEMORY REPRESENTATION TO PHYSICAL MEMORY IN A PROGRAMMABLE LOGIC DEVICE

FIELD OF THE INVENTION

The invention relates to memory circuit implementation methods. More particularly, the invention relates to methods of mapping a logical memory representation to physical memory, e.g., for implementation in a programmable logic device (PLD).

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Circuit designs to be implemented in PLDs are often specified in programmatic form using a Hardware Description Language (HDL) such as Verilog or VHDL. The use of an HDL allows a circuit designer to design and document an electronic system at various levels of abstraction. For example, circuit designs to be implemented in PLDs can be modeled using an HDL. HDL designs can be simulated and tested using an appropriate software-based synthesis tool.

A synthesis tool is then used to compile the abstract HDL representation of the circuit design and translate the HDL design into a less abstract implementation in terms of actual logic gates. The output of a synthesis tool can be specified in any of a variety of different forms including, but not limited to, a netlist or a bitstream. One example of a synthesis tool is the Xilinx® Synthesis Tool (XST), which is available from Xilinx® Inc. of San Jose, Calif.

To minimize design time for a user design in a PLD, it is common practice to provide pre-designed "cores" that implement common functions in the PLD. These cores can be included in a user design with little or no risk of malfunction, and can significantly speed up the design cycle. Typical cores can provide, but are not limited to, digital signal processing (DSP) functions, memories, storage elements, and math functions. Some cores include an optimally floor planned layout targeted to a specific family of PLDs. Cores can also be parameterizable, i.e., allowing the user to enter parameters to activate or change certain core functionality, whereby one or more attributes of the design are determined at compile time. In other words, values can be specified for scalable core parameters such as data path width, memory width and depth, and so forth. The design is then produced, scaled to meet the needs of the user as determined by the parameter values.

Traditionally, HDL code is used to create parameterized cores. A parameterized core is a design in which one or more attributes of the design are determined at compile time, as determined by parameters specified by the user. An attribute, whether a VHDL generic, a Verilog parameter, or any other attribute of an HDL design, can be determined using one or more HDL constant functions. Examples of circuit design attributes can include, but are not limited to, bus widths, a number of instantiations for a particular circuit component, and so forth.

An HDL constant function is a function that receives a compile-time constant as input and produces an HDL compile-time constant as an output, i.e., a circuit attribute. Thus, an HDL constant function is executed at compile time and calculates a value for a circuit attribute. The HDL constant function typically is incorporated into a synthesizable HDL design in that the HDL design is implemented in hardware. The HDL constant function itself, however, is not translated into hardware and, as such, is generally not synthesized. Instead, one or more attributes determined by the HDL constant function are used during synthesis.

In illustration, one example of an HDL constant function can be one that drives HDL generate statements to control the structure of the circuit in an effort to optimize the circuit for speed, minimal resource usage, or optimal power usage. Such an HDL constant function is executed at compile time by the synthesis tool. The values determined for the various HDL circuit attributes would then be used during synthesis of the HDL design by the synthesis tool.

As their name suggests, HDL constant functions are coded in an HDL. From the above example, it can be seen that an HDL constant function can be relatively complex. HDLs, however, are unable to utilize, or have a limited ability to employ, the types of abstractions needed to efficiently implement complex methods or data manipulations. For example, HDLs typically have limited data types and lack complicated data-type abstraction and conversion facilities. These limitations make it difficult to efficiently perform the more complex operations commonly found within HDL constant functions. In consequence, the time needed to develop and/or maintain an HDL constant function can be significant. Further, the execution of an HDL constant function can be time consuming, thereby contributing to increased synthesis times.

In short, HDL code has inherent limitations, and may not be able to solve the complex parameter sets needed to generate the most optimal implementation of a core design. Therefore, it is desirable to utilize other methods of specifying complex cores that can accommodate more complex parameters. It is further desirable to provide complex core-generation processes that can take advantage of this increased capability.

SUMMARY OF THE INVENTION

The invention provides computer-implemented methods of mapping a logical representation of a memory to physical memory, e.g., in a programmable logic device (PLD). According to one embodiment, the logical representation of the memory is input into the computer. The computer then generates an initial solution (e.g., a column-based solution) for the memory. In a column-based solution, the primitives are arranged such that each column includes only one type of primitive. The column-based solution generated in this step uses the minimum number of primitives attainable by a column-based approach. The column-based solution is then modified to reduce multiplexing, e.g., by replacing two primitives that are cascaded in depth with two primitives that are cascaded in width. In some embodiments, the total number of primitives can be reduced by the modification. The resulting physical representation of the memory is then output by the computer.

In some embodiments, the physical representation of the memory is then utilized to create an implementation of the memory targeted to a PLD. In some of these embodiments, each of the primitives comprises a programmable configuration of a RAM (random access memory) block in the PLD.

The invention also provides media that store code for performing the methods of the invention, and computer systems for executing these methods.

BRIEF DESCRIPTION OF THE DRAWINGS

The present invention is illustrated by way of example, and not by way of limitation, in the following figures.

FIGS. 7-9 illustrate three fixed primitive solutions for a 16×3 k memory circuit.

FIG. 10 illustrates an alternative solution for a 16×3 k memory circuit.

FIG. 11 illustrates a column-based solution for a 21×5 k memory circuit.

FIG. 12 illustrates an alternative solution for a 21×5 k memory circuit.

DETAILED DESCRIPTION OF THE DRAWINGS

Figure 1:
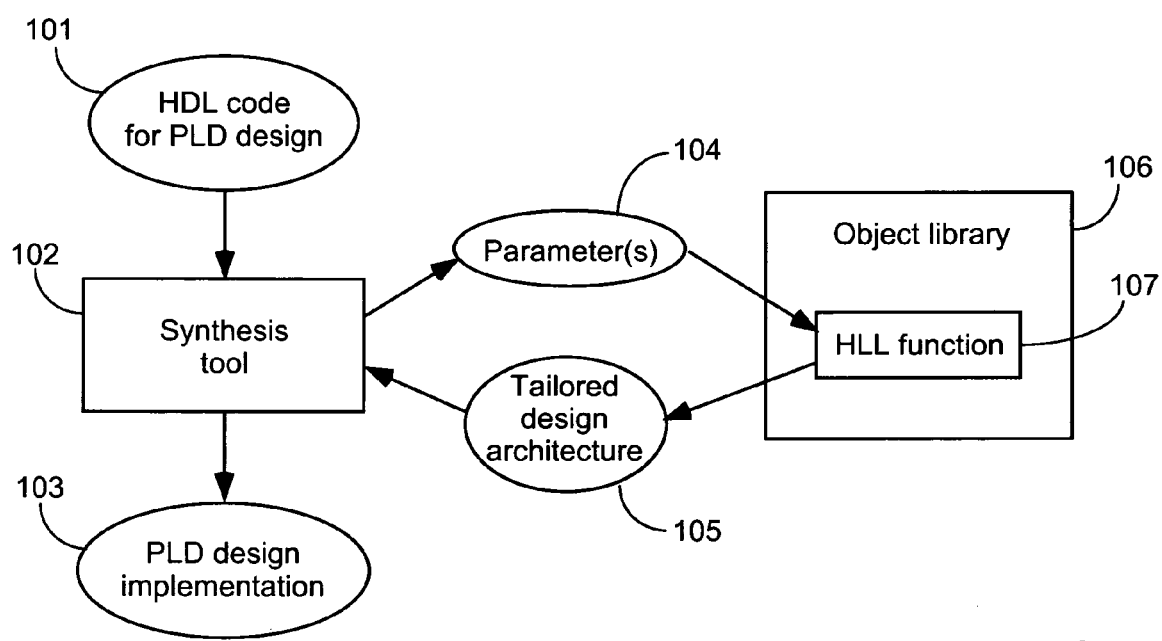
FIG. 1 illustrates a system for use in generating an implementation of a PLD design according to an embodiment of the present invention.

The present invention is applicable to a variety of systems for designing applications for programmable logic devices (PLDs). The present invention has been found to be particularly applicable and beneficial for design systems used to develop parameterized cores for PLDs. For purposes of providing a clear explanation of the invention, a detailed example is presented in which the PLD design is a memory circuit core, and the target PLD for the exemplary core is a field programmable array (FPGA) including configurable RAM (random access memory) blocks (BRAMs). However, the present invention is not so limited, and the disclosed embodiments are merely exemplary of the invention, which can be embodied in various forms. Therefore, specific structural and/or functional details disclosed herein are not to be interpreted as limiting, but merely as a basis for the claims and as a representative basis for teaching one skilled in the art to variously employ the inventive methods in virtually any appropriately detailed structure. Further, the terms and phrases used herein are not intended to be limiting, but rather to provide an understandable description of the invention.

As described above, cores for PLD designs are typically implemented in hardware description language (HDL) code such as VHDL or Verilog. HDL code is primarily used to describe electronic circuits. HDL code provides a level of parameterization that allows the same block of code to be re-customized depending on the application. Often, these parameters control circuit characteristics such as pipeline depth or data path width, but can be used to parameterize many different types of characteristics for the circuit.

Some cores can be better implemented without a fixed architecture. Instead, the optimal architecture of the core is dependent upon parameters given by the user. One example of such a core is a Block Memory Generator. A Block Memory Generator core aggregates block memory primitives to form a memory space of parameterized width and depth. The core must develop a blueprint for how to arrange the primitives to determine the architecture of the desired memory space. This blueprint is referred to herein as a "tailored design architecture". The optimal design architecture is determined by several factors and goals as specified by the user. These goals can include, for example, minimizing the number of memory primitives, maximizing performance, minimizing power consumption, or some other desired design goal. Each of these goals changes how the optimal design architecture is generated and thus changes the architecture of the design. While the results of the memory primitive are all logically similar in that they implement the same desired memory space, they may differ greatly in how they accomplish the user's design goals.

When designing highly parameterizable code, a hardware design engineer may be presented with a situation wherein the most optimal architecture is best determined by performing an adaptable process, rather than by utilizing a scalable but fixed design. For example, the Block Memory Generator core described above provides users with a memory that behaves as a single entity. It is often the case that the user's desired memory configuration does not fit into a single BRAM (block RAM) primitive in the target PLD. Therefore, the Block Memory Generator core must determine how to use multiple BRAM primitives to implement the desired memory space.

Choosing the optimal coverage pattern for individual primitives is important when generating an efficient and high performance memory implementation. Reducing the number of primitives used by the implementation frees up the additional resources for other purposes, allowing these freed-up resources to be used for a larger user design. Reducing the amount of multiplexing required to generate the output of the memory reduces the clock-to-out time, allowing the design to run at higher frequencies. In DSP and other high-performance applications that run at high frequencies, performance is a critical design requirement. However, embedded and consumer markets may require a solution that uses a minimum of power, which is achieved by minimizing the number of primitives enabled at any given time.

These design goals can be accomplished by carefully considering how to arrive at the best design and by writing a series of steps to achieve this goal. However, using HDL code to generate this series of steps may not be practical in some cases. HDL paradigms emphasize generating a code structure that can be turned into a physical description of a circuit, and are not well suited to generating flexible code. High level languages (HLLs) such as C and C++ are much better suited to developing flexible code, but are poor descriptors of hardware. HLLs provide a level of abstraction and additional data types that are of great value when developing complex code. These features are not found in typical HDLs, making them unsuitable for developing complex code.

In U.S. patent application Ser. No. 11/450,222, entitled "Using High-Level Language Functions in HDL Synthesis Tools" and filed on Jun. 9, 2006, Ward et al. describe a method of using a high-level language from within a hardware description language. (U.S. application Ser. No. 11/450,222 is co-pending with the present application and is commonly assigned therewith, and is hereby incorporated herein by reference.) Ward et al. describe a general method for replacing any function call in an HDL with a high-level language (HLL) function call. Ward et al.'s method of using HLL functions with HDL synthesis tools can include, for example, identifying an attribute of the HDL representation of a circuit design that is resolved at compile time, and then determining a value for the attribute using an HLL function when compiling the HDL representation of the circuit design.

According to an embodiment of the present invention, methods such as those described by Ward et al., for example, can be used to allow the HDL design, at compile time, to execute a complicated function written in a high level language. These HLL function calls can be made throughout the design, if desired, to determine the design architecture. Hardware descriptions can then be architected generically and the results of the HLL function calls can be used to determine the actual architecture of the design. Therefore, the architecture can be tailored to the specific needs of the particular application in which the design will be used.

FIG. 1 is a schematic diagram illustrating an exemplary system for use in generating an implementation of a PLD design in accordance with one embodiment of the present invention. The system of FIG. 1 includes a synthesis tool 102 and an object library 106. Synthesis tool 102 processes a PLD design 101 implemented in HDL code. Synthesis tool 102 translates PLD design 101 into a PLD design implementation 103, such as a logic gate representation of the PLD design, a netlist of the design, or a bitstream implementing the design in a target PLD.

Synthesis tool 102 is also configured to execute one or more HLL functions 107 in conjunction with synthesizing the HDL code. The HLL functions can be used in lieu of HDL functions that are evaluated at compile time. In one embodiment, synthesis tool 102 is implemented as the Xilinx® Synthesis Tool (XST), which is available from Xilinx, Inc. of San Jose, Calif. However, it should be appreciated that any of a variety of different software-based synthesis tools can be used if configured as described herein.

Synthesis tool 102 passes one or more parameters 104 to HLL function 107, which is included in object library 106. Each of the HLL functions 107, when executed, can calculate one or more attributes of the PLD design described by HDL code 101. In aggregate, these attributes specify a design architecture tailored to the requirements of the target system, as specified by parameters 104. The data specifying the tailored design architecture 105 are then returned from the HLL function 107 to the synthesis tool 102. Synthesis tool 102 then uses the HDL code 101 and the data 105 regarding the tailored design architecture to generate an implementation 103 of the PLD design.

An example of data 105 is provided below, as part of the detailed explanation of an exemplary Block Memory Generator core. Data 105 can include, for example, a listing of primitives for a target PLD that are utilized in the tailored design architecture, and/or a description of input and output ports for the tailored design architecture.

The approach illustrated in FIG. 1 allows the hardware design (e.g., the HDL core) to be independent of the HLL function that determines the architecture of the hardware design. Thus, the design problem is separated into two independent tasks: the design of the hardware (the HDL code) to take input from the HLL function to determine the architecture; and the design of one or more HLL functions to determine the architecture. Separation of the hardware design from the architectural design allows future changes in the architectural design to be implemented with little or no impact within the HDL description of the hardware. For example, such changes might be desirable when an existing core is adapted to support a new family of PLD devices, e.g., a new PLD architecture.

Figure 2:
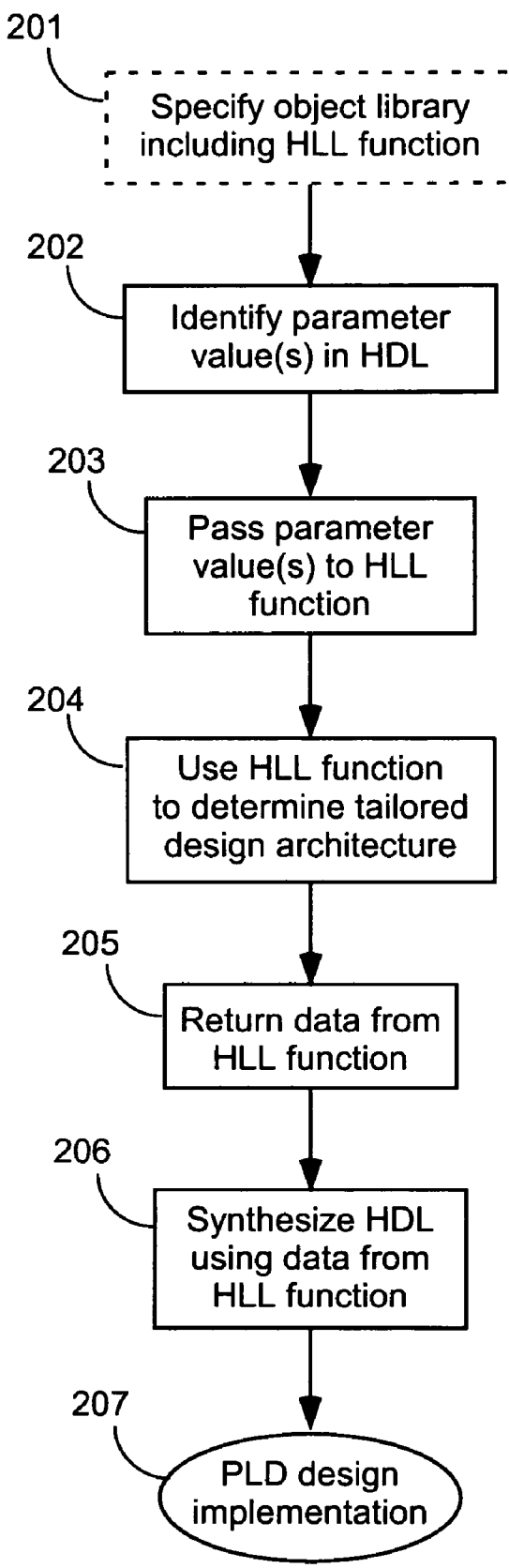
FIG. 2 is a flow chart illustrating a method of compiling an HDL description of a PLD design according to an embodiment of the present invention.

FIG. 2 is a flow chart illustrating a method of compiling an HDL description of a PLD design in accordance with another embodiment of the present invention. In optional step 201, an object library is specified that includes the HLL function. In step 202, one or more parameter values are identified in the HDL description that are directed to one of the HLL functions in the object library. In step 203, the HDL code passes the parameters that are used to determine the architecture into the HLL function for use. These parameters ultimately constrain the architecture into a design that can be constructed by the HDL code. The HLL function is able to use any feature of the high-level language to determine the resulting architecture (step 204), which can result in a more robust solution than would be possible if the architecture was determined in the HDL code.

In step 205, the tailored architecture generated by the HLL code is returned by the HLL function. The return from the HLL function may include information about how to construct the overall architecture of the PLD design, for example. Also included may be information about how to construct sub-modules of the design. For example, the Block Memory Generator described above may return several parameters that describe the size of the desired memory with respect to the narrowest port, as well as a primitive count to describe to the HDL code how many primitives are used in the tailored design. The Block Memory Generator may also return, for example, a number of values for each primitive that describe how that primitive should be configured and wired.

In step 207, the design implementation is constructed using the HDL description and the results of the HLL function. For example, if the architecture includes multiple sub-modules being constructed and wired together, the HDL code could use a loop to construct each sub-module individually and wire it into the final result.

The methods of the invention are well suited for designing cores such as the Block Memory Generator or other memory generators such as a FIFO generator. However, the invention is not so limited. For example, the described methods can also be applied, for example, to DSP (digital signal processing) applications where there is a high amount of design replication, but each block may be different. Designs where the data path may be constructed from pre-existing pieces may also be suited to using an HLL language to determine the resulting architecture. Those of skill in the art will readily perceive other applications to which the present invention may be applied.

Figure 3:
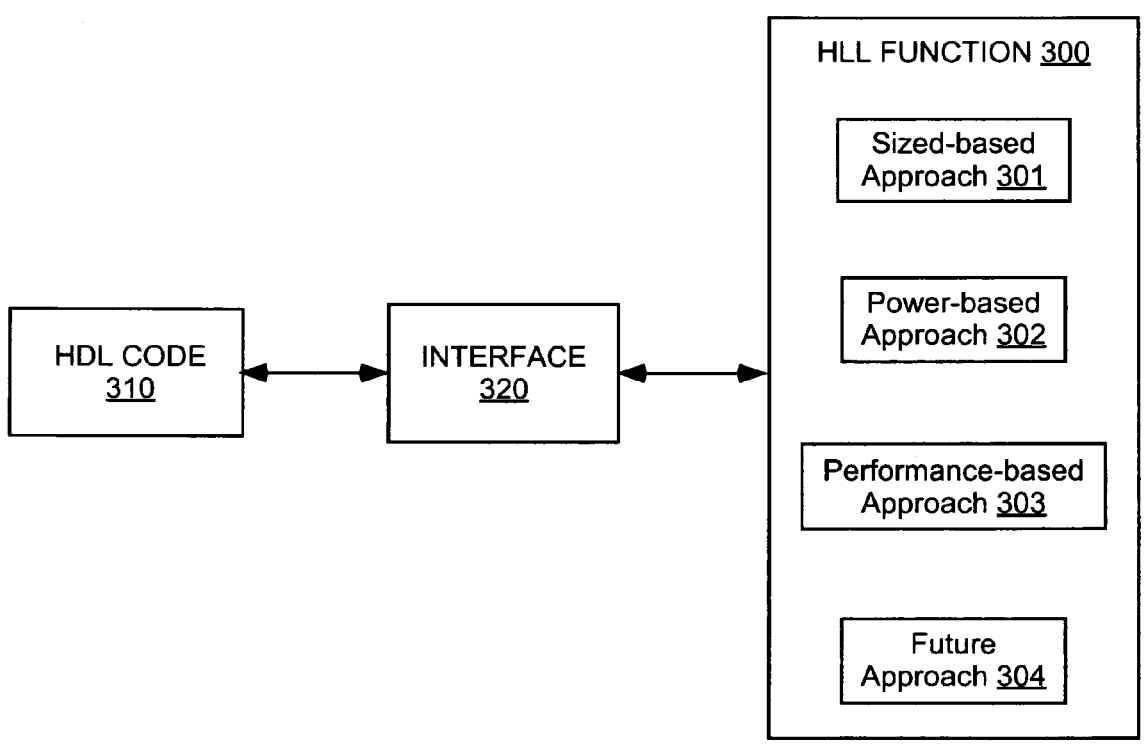
FIG. 3 illustrates an interface between HDL code for a PLD design and a function written in a high-level language according to an embodiment of the present invention.

In one embodiment, a Block Memory Generator core written in HDL uses a call to an external HLL function written in C++ to determine the tailored design architecture, i.e., to generate a memory circuit that behaves as a single larger primitive. In this embodiment, several different approaches are provided in the HLL function 300 for determining the tailored design architecture for the memory, as shown in FIG. 3, and HLL function 300 selects one of these approaches based on the design requirements specified in the HDL code 310 and passed through interface 320. A first approach 301 generates a solution that uses the smallest number of primitives. A second approach 302 generates a solution that uses the smallest amount of power. A third approach 303 generates a solution that provides maximum performance.

Because the HDL code is independent of the HLL function, the selection of which approach to use does not affect how the individual primitives are constructed together in the HDL code. Implementing HLL function 300 independently from HDL design 310 and interface 320 allows for additional approaches 304 to be created and included in the HLL function, achieving other design goals that may arise in the future. Thus, HDL code 310 and interface 320 may be implemented in fixed code, while HLL function 300 remains flexible and adaptable.

In the pictured embodiment, exemplary HLL function 300 includes several different approaches for generating a design architecture according to the specified design requirements. However, in other embodiments, more than one HLL function is provided. For example, in some embodiments each approach is implemented as a separate HLL function.

The tailored design architecture created by HLL function 300 and passed back to HDL code 310 via interface 320 can include, for example, the characteristics of the constituent primitives and the position of each primitive (e.g., in terms of the starting bit and starting depth). The tailored design architecture can also include parameters pertaining to the whole design, such as port ratios and total primitive count.

The tailored design architecture for the exemplary Block Memory Generator core includes the information shown in Table 1.

TABLE 1

| Index | Description |
|---|---|
| 0 | Return Exit Code |
| 1 | Desired Width |
| 2 | Desired Depth |
| 3 | Smallest Port |
| 4 | Write A port ratio |
| 5 | Read A port ratio |
| 6 | Write B port ratio |
| 7 | Read B port ratio |
| 8 | Total primitives used |
| 9 | Prim 0 -- Start Width |
| 10 | Prim 0 -- Start Depth |
| 11 | Prim 0 -- Prim Width |
| 12 | Prim 0 -- Prim Depth |
| 13 | Prim 0 -- Used Width |
| 14 | Prim 1 -- Start Width |
| 15 | Prim 1 -- Start Depth |
| 16 | Prim 1 -- Prim Width |
| 17 | Prim 1 -- Prim Depth |
| 18 | Prim 1 -- Used Width |
| 19 . . . | Prim 2 -- . . . |

Indices 0 through 8 describe the overall design of the core (e.g., the tailored design architecture). These values may be applied to each primitive, or may describe the behavior of a single unique element. Indices 9 through 13 describe how primitive 0 should be integrated into the tailored design architecture for the memory. Elements 9 and 10 describe the position of the primitive with respect to the 0th bit and memory location. Elements 11 and 12 describe which primitive to generate, and element 13 describes how many bits of the primitive are used in the solution. This pattern of five elements is repeated throughout the remaining array to describe additional primitives.

The array generated by the selected approach in HLL function 300 is then parsed by the HDL code within the core design. In this embodiment, the HDL code loops over the total number of primitives, wiring up the inputs and outputs of the memory primitives to the appropriate connections of the binary decoder on the memory input side, and to the output multiplexer on the memory output side.

Figure 4:
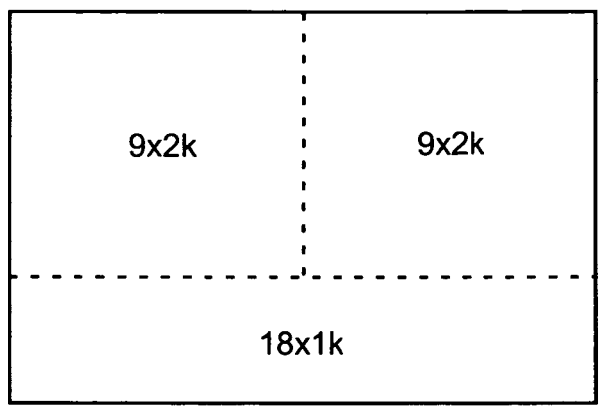
FIGS. 4-6 illustrate three design architectures that can be used for a 16×3 k memory circuit, depending on the specified requirements for the circuit.
Figure 5:
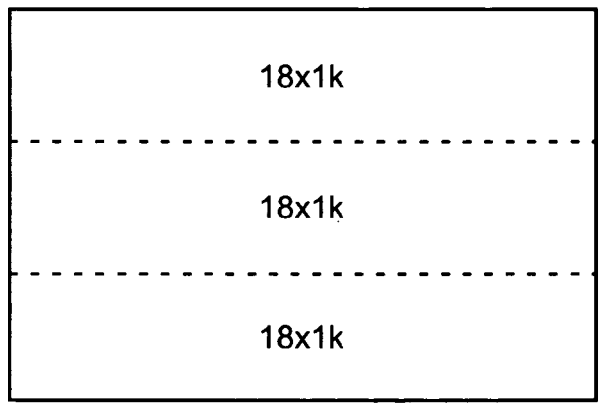
Figure 6:
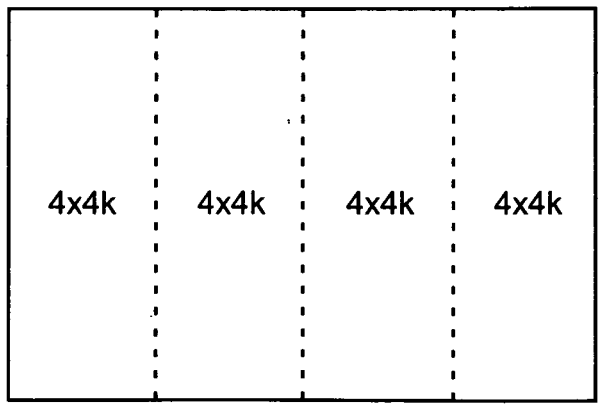

FIGS. 4-6 illustrate in diagrammatical form exemplary tailored design architectures for the memory. These exemplary architectures are generated by approaches 301-303, respectively, of FIG. 3. These diagrammatical design architectures are all valid architectures for a 16×3 k memory circuit that are generated by different approaches to achieve different design goals. The primitives used in these architectures are all available, for example, in Virtex®-4 family FPGAs available from Xilinx, Inc.

The tailored design architecture of FIG. 4 is optimized for size, e.g., to use the smallest number of memory block primitives that can be used to implement a memory circuit having the specified attributes. After reducing the number of primitives, the multiplexing on the memory output path is reduced as much as possible. Therefore, this design architecture is one of the smallest of the three architectures shown in FIGS. 4-6. In other words, the smallest number of primitives is included, and also the smallest amount of other programmable logic resources. In the embodiment of FIG. 4, two 9×2 k memory primitives are used, as well as one 18×1 k primitive.

The tailored design architecture of FIG. 5 is optimized for power consumption, e.g., to consume the smallest possible amount of power that can be used to implement a memory circuit having the specified attributes. In the embodiment of FIG. 5, three 18×1 k memory primitives are used.

The tailored design architecture of FIG. 6 is optimized for performance, e.g., to provide the fastest possible implementation of the specified memory circuit. In the embodiment of FIG. 6, four 4×4 k memory primitives are used.

Table 2 shows the data passed back to the HDL code by the HDL/HLL interface for each of these three design architectures.

TABLE 2

| Index | Description | FIG. 4 | FIG. 5 | FIG. 6 |
|---|---|---|---|---|
| 0 | Return Exit Code | 0 | 0 | 0 |
| 1 | Desired Width | 16 | 16 | 16 |
| 2 | Desired Depth | 3120 | 3120 | 3120 |
| 3 | Smallest Port | 0 | 0 | 0 |
| 4 | Write A port ratio | 1 | 1 | 1 |
| 5 | Read A port ratio | 1 | 1 | 1 |
| 6 | Write B port ratio | 1 | 1 | 1 |
| 7 | Read B port ratio | 1 | 1 | 1 |
| 8 | Total primitives used | 3 | 3 | 4 |
| 9 | Prim 0 -- Start Width | 0 | 0 | 0 |
| 10 | Prim 0 -- Start Depth | 0 | 0 | 0 |
| 11 | Prim 0 -- Prim Width | 9 | 18 | 4 |
| 12 | Prim 0 -- Prim Depth | 2048 | 1024 | 4096 |
| 13 | Prim 0 -- Used Width | 9 | 16 | 4 |
| 14 | Prim 1 -- Start Width | 9 | 0 | 4 |
| 15 | Prim 1 -- Start Depth | 0 | 1024 | 0 |
| 16 | Prim 1 -- Prim Width | 9 | 18 | 4 |
| 17 | Prim 1 -- Prim Depth | 2048 | 1024 | 4096 |
| 18 | Prim 1 -- Used Width | 7 | 16 | 4 |
| 19 | Prim 2 -- Start Width | 0 | 0 | 8 |
| 20 | Prim 2 -- Start Depth | 2048 | 2048 | 0 |
| 21 | Prim 2 -- Prim Width | 18 | 18 | 4 |
| 22 | Prim 2 -- Prim Depth | 1024 | 1024 | 4096 |
| 23 | Prim 2 -- Used Width | 16 | 16 | 4 |
| 24 | Prim 3 -- Start Width | | | 12 |
| 25 | Prim 3 -- Start Depth | | | 0 |
| 26 | Prim 3 -- Prim Width | | | 4 |
| 27 | Prim 3 -- Prim Depth | | | 4096 |
| 28 | Prim 3 -- Used Width | | | 4 |

An exemplary HLL function for determining a design architecture for a memory circuit is now described. When applied to the previous example, this particular function results in the embodiment illustrated in FIG. 4. Therefore, parameters passed to the HLL function for this function include parameters indicating that a minimum-size solution is desired. However, as a secondary consideration, performance is also improved where it is possible to do so without increasing the overall size of the circuit.

The most straightforward approach to designing a variably-sized memory circuit using primitives from a PLD library is well known, and may be called the "fixed primitive approach". In the fixed primitive approach, a single primitive is used, and is simply repeated in width and depth until the width and depth of the desired memory space have been covered. Although this solution is simple, the results are far from optimal, often resulting in the use of more primitives than necessary or requiring additional programmable resources to stitch the primitives together, e.g., requiring additional multiplexers on the primitive outputs to select the ultimate memory output signals. These additional multiplexers not only use additional programmable resources, but can also reduce the performance of the circuit by increasing the clock-to-out delay.

FIGS. 7-9 illustrate three ways in which a single primitive can be utilized to provide a 16×3 k memory circuit. The dashed lines show the extent of the primitives. The cross-hatched area shows how much of the primitives are actually used to implement the 16×3 k memory. In the circuit of FIG. 7, four 9×2 k memory primitives are utilized. In the circuit of FIG. 8, four 4×4 k primitives are utilized. In the circuit of FIG. 9, three 18×1 k primitives are utilized.

In general, it is desirable to use as few primitives as possible, because each primitive typically has the same physical size on the PLD. For example, each primitive might represent a different configuration of a programmable block RAM (BRAM) in a PLD, each of which can be configured to implement a block RAM of various widths and lengths. For example, each block RAM in a Virtex-4 FPGA can be configured as a 36×512 RAM, an 18×1 k RAM, a 9×2 k RAM, a 4×4 k RAM, a 2×8 k RAM, or a 1×16 k RAM. The Virtex-4 RAM block is described in detail in pages 109-162 of the "Virtex-4 User Guide, v1.5", published Mar. 21, 2006 by Xilinx, Inc., which pages are hereby incorporated herein by reference.

The solutions shown in FIGS. 7 and 8 use more primitives than are actually necessary to implement the circuit (compare with the implementation of FIG. 9, for example). The solution of FIG. 9 uses fewer primitives, but requires a 3-to-1 multiplexer on the output. This 3-to-1 multiplexer cannot be implemented in a 4-input lookup table (LUT) such as are included in the Virtex-4 FPGAs. Therefore, two LUTs are required, which introduces two LUT delays into the output path. It is preferable to provide a solution that requires only a 2-to-1 multiplexer, which can be implemented in a single LUT.

A second well known method of designing a variably-sized memory circuit using primitives from a PLD library may be referred to as the "column-based approach". A column-based solution is a solution in which each column of primitives includes only one type of primitive, although different columns might include different primitives. For example, the implementations shown in FIGS. 7-9 are all column-based solutions, as well as fixed primitive solutions. Column-based solutions are known to be used to implement memory circuits. For each column, the column-based approach iterates through each available primitive and recursively calls itself on the remaining uncovered memory space.

Known memory implementation software generates several column-based solutions, such as those shown in FIGS. 7-9, and selects the solution having the smallest number of primitives. Therefore, in the present example, the known software would provide the solution shown in FIG. 9. However, the known software would not provide, for example, the solution shown in FIG. 10, which also uses only three primitives, and requires only a 2-to-1 multiplexer on the output path rather than a 3-to-1 multiplexer as in FIG. 9. The solution of FIG. 10 uses two different types of primitives, two 9×2 k primitives and one 18×1 k primitive, but the solution is not column-based.

As has been demonstrated, a column-based solution does not take into account other design considerations, such as circuit performance (e.g., in the form of output multiplexing). Therefore, it is desirable to provide other methods by which design architectures can be generated for memory circuits that take into account design considerations other than size.

FIG. 11 illustrates a column-based solution for a 21×5 k memory to be implemented in a Virtex-4 FPGA, using the primitives available for that PLD. Clearly, the column-based solution of FIG. 11 uses seven primitives, with five being configured as depth-cascaded 18×1 k RAM primitives, and two being configured as depth-cascaded 4×4 k RAM primitives. The output of the five 18×1 k RAM primitives must be multiplexed together to generate the output of the memory core. In other words, eighteen 5-to-1 multiplexers are needed for the first eighteen bits.

Other solutions exist that do not require the high level of multiplexing required by the solution of FIG. 11. For example, the solution shown in FIG. 12 uses the same number of primitives as the solution of FIG. 11. However, the 5-to-1 multiplexers are no longer needed, being replaced by 3-to-1 and 2-to-1 multiplexers for seventeen of the bits. The first nine bits require nine 3-to-1 multiplexers, and the next eight bits require eight 2-to-1 multiplexers. The remaining four bits for the solution of FIG. 12 no longer require a multiplexer. Therefore, the solution of FIG. 12 is clearly superior to that of FIG. 11. However, the solution of FIG. 12 will not be found by a Block Memory Generator that follows either the fixed primitive approach or the column-based approach.

Figure 13:
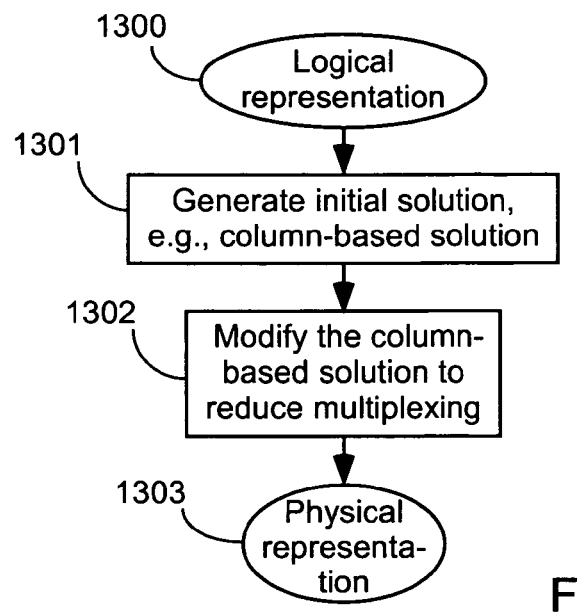
FIG. 13 is a flow chart illustrating a method of mapping a logical representation of a memory to a physical representation of the memory according to an aspect of the present invention.

One aspect of the present invention provides a third method of designing a variably-sized memory circuit using primitives from a PLD library that overcomes the limitations of the fixed primitive approach and the column-based approach. According to these methods, a two-step design process is followed, as shown in FIG. 13. In step 1301, an initial solution (e.g., a column-based solution) is generated from a logical representation 1300 of the memory. The column-based solution uses a minimum number of primitives achievable from a column-based approach. In step 1302, the column based solution is optimized to improve multiplexing performance. During this second step, it is sometimes also possible to reduce the number of primitives used in the solution. The result 1303 is a physical representation of the memory circuit that was described by the logical representation.

Figure 14:
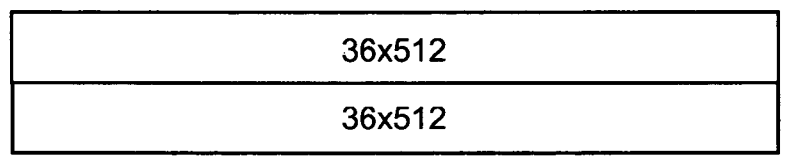
FIG. 14 illustrates a first exemplary modification that can be made to a column-based design.

The primary method of optimizing the column based solution is to replace primitives that are cascaded in depth by primitives that are cascaded in width. For example, two primitives cascaded in depth can be replaced by two primitives that are cascaded in width. This replacement results in an increase in the performance of the output multiplexer, and therefore the performance of the overall circuit, by reducing the width of the output multiplexer. This reduction in multiplexer size can also result in a reduction of the overall resources required to implement the circuit. For example, FIG. 14 provides an example in which two 36×512 primitives cascaded in depth are replaced by two 18×1 k primitives cascaded in width. The total memory space covered by these primitives has not changed, as shown in FIG. 14. However, the address decode logic required on the input side, and the output multiplexers required on the output side, of the memory on the left side of FIG. 14 are no longer necessary in the new implementation.

In the example of FIG. 14, the depth and width of the originally cascaded primitives (the two 36×512 primitives taken together) are equal to the width and depth, respectively, of the two resulting cascaded primitives (the two 18×1 k primitives taken together). However, this need not necessarily be the case when only some of the bits in the primitive are actually needed to implement the design. A primitive can be replaced as described as long as the width of the primitive being replaced (i.e., the original primitive) is a multiple of the width of a narrower primitive. For example, two 2×8 k primitives can be replaced by two 1×16 k primitives, and so forth.

The primitives in Xilinx primitive libraries for the Virtex-4 devices only provide parity bits for primitives wider than 4 bits, e.g., 9-bit, 18-bit, and 36-bit wide primitives. For the most efficient memory design, it is therefore preferable when targeting Xilinx FPGAs to use as many primitives with these widths as possible, because the parity bits provide additional memory space. For example, the memory space covered by an 18×1 k memory with parity is two bits wider than the memory space covered by an 18×1 k memory without parity. In other words, when parity is not used for an 18×1 k memory primitive, the memory space covers only 16×1 k bits.

Figure 15:
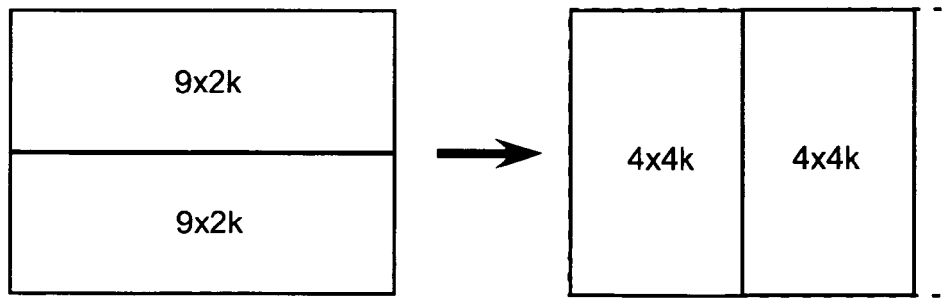
FIG. 15 illustrates a second exemplary modification that can be made to a column-based design.

This can cause a problem, for example, when trying to optimize memories containing two cascaded 9×2 k memories as shown in FIG. 15. In order to optimize the memory to two 4×4 k primitives, use of the parity bits must be given up, resulting in a memory space that does not cover the original memory space. However, if the required memory is eight bits or less in width, then this substitution can still be made.

When the initial design architecture is created using the column-based approach, the column-based solution may generate an architecture that covers a wider width than the desired memory space. For example, FIG. 11 provides one example of a column-based solution that extends beyond the desired memory space. By keeping track of these extra bits in width, it is possible to utilize these extra bits to perform the 9×2 k to 4×4 k primitive replacement, as shown (for example) in FIG. 15. As long as the original column-based solution extends beyond the desired width, and the extra bits have not already been consumed by an earlier replacement, replacements such as that shown in FIG. 15 can still take place.

The solution shown in FIG. 12 is an example of a memory that has been optimized from the column-based solution of FIG. 11, according to the method shown in FIG. 13. The wide primitives have been replaced by deeper primitives wherever possible. For example, four of the 18×1 k primitives were replaced by two pairs of 9×2 k primitives. However, because the original solution extended beyond the desired width, one pair of the 9×2 k substitute primitives was further replaced by a pair of width-cascaded 4×4 k primitives, without giving up overall coverage of the desired memory space. Additionally, the original pair of depth-cascaded 4×4 k primitives was replaced by a pair of width-cascaded 2×8 k primitives.

Note that the 18×1 k primitive overlaps with one of the 2×8 k primitives. This is not a problem; the overlapping portion of the 18×1 k primitive is merely left unused.

Figure 16:
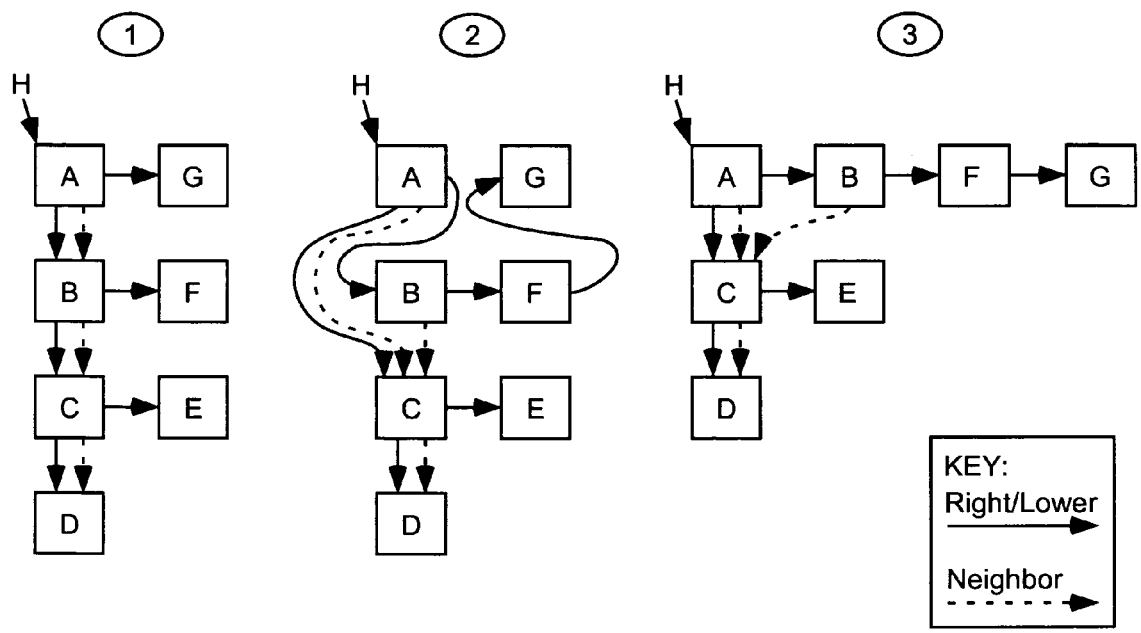
FIG. 16 illustrates a first exemplary modification of a column-based design to reduce multiplexing.

FIG. 16 illustrates a first exemplary modification of a column-based design to reduce multiplexing (e.g., see step 1302 of FIG. 13). The optimal column-based implementation of this design is shown in the illustrated step "1". This design is used as the starting point for optimization. The column-based design is then put into a tree structure. The tree structure is a convenient data-structure that allows the individual primitives to be manipulated more easily. Thus, step 1 of FIG. 16 is a column-based solution having a tree structure. The nodes of the tree are labeled A through G, and correspond to primitives in a physical representation of the memory.

In one embodiment, the nodes used to form the tree contain three types of pointers. The "lower" pointer points to the node below in the data structure. The "right" pointer points to the node to the right in the data structure. The lower and right pointers are used to keep track of the column relationship between the nodes, and are illustrated as solid lines in FIG. 16. Using these two pointers, the tree can be traversed without forming a loop. An additional pointer, the "neighbor" pointer, is used to track the relationship of which node or nodes lie directly below the current node in the current design implementation. The neighbor pointers are illustrated as "dotted" arrows in FIG. 16.

As described above, step 1 of FIG. 16 shows a tree structure representing a column-based solution for the memory. In this example, it is first determined that nodes A and B may be optimized. The sub-trees CDE, F, and G are portions of the tree that are leaves of nodes A and B, and may be of any configuration.

Step 2 shows the primitive replacement strategy. Nodes A and B are of the same type and can be replaced with narrower primitives. The right pointer on node A is assigned to node B. The lower pointer on node A is then set to point to the node pointed to by B's lower point, i.e., node C. Node B's right-most pointer (F's right pointer) is then set to point to node G. Note that if there were more nodes to the right of nodes B and F, the right pointer of the node at the end of the right pointer traversal would be set to point to node G.

Step 3 shows the final configuration of the modified solution. The primitive indices for nodes A and B are set to represent the primitives that are half the width and twice the depth of the previous values. Note that for each substitution, all of the sub-trees (G, F, CDE) are kept intact.

When performing an optimization that requires giving up use of the parity bits, as shown in FIG. 15 and as described in conjunction with that figure, it is necessary to keep track of the unused bits for all the remaining primitives in that column. To determine the location of each primitive in terms of width and depth, the tree structure is traversed from the head pointer (e.g., pointer "H" in FIG. 16). Therefore, if the primitives at the top of a column are replaced and no longer use the parity bits, all the primitives that lie within that column must now also give up use of the parity bits. For example, the 18×1 k primitive in the embodiment of FIGS. 11-12 provides an example of unused bits. The four uppermost 18×1 k primitives in FIG. 11 were replaced by four 9×2 k primitives. Two of these 9×2 k primitives were then replaced by two 4×4 k primitives, reducing the overall width of the column by one bit. Therefore, the lower-most 18×1 k primitive must also lose one of its bits. The neighbor pointer is used to keep track of the original column relationship, and when unused bits must be assigned, a traversal of the neighbor pointers is all that is required to determine the primitives that lie below in the original column.

Figure 18:
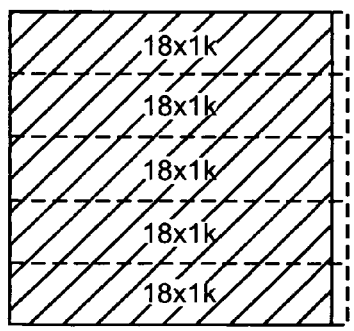
FIG. 18 illustrates a column-based solution for a 17×5 k memory.
Figure 17:
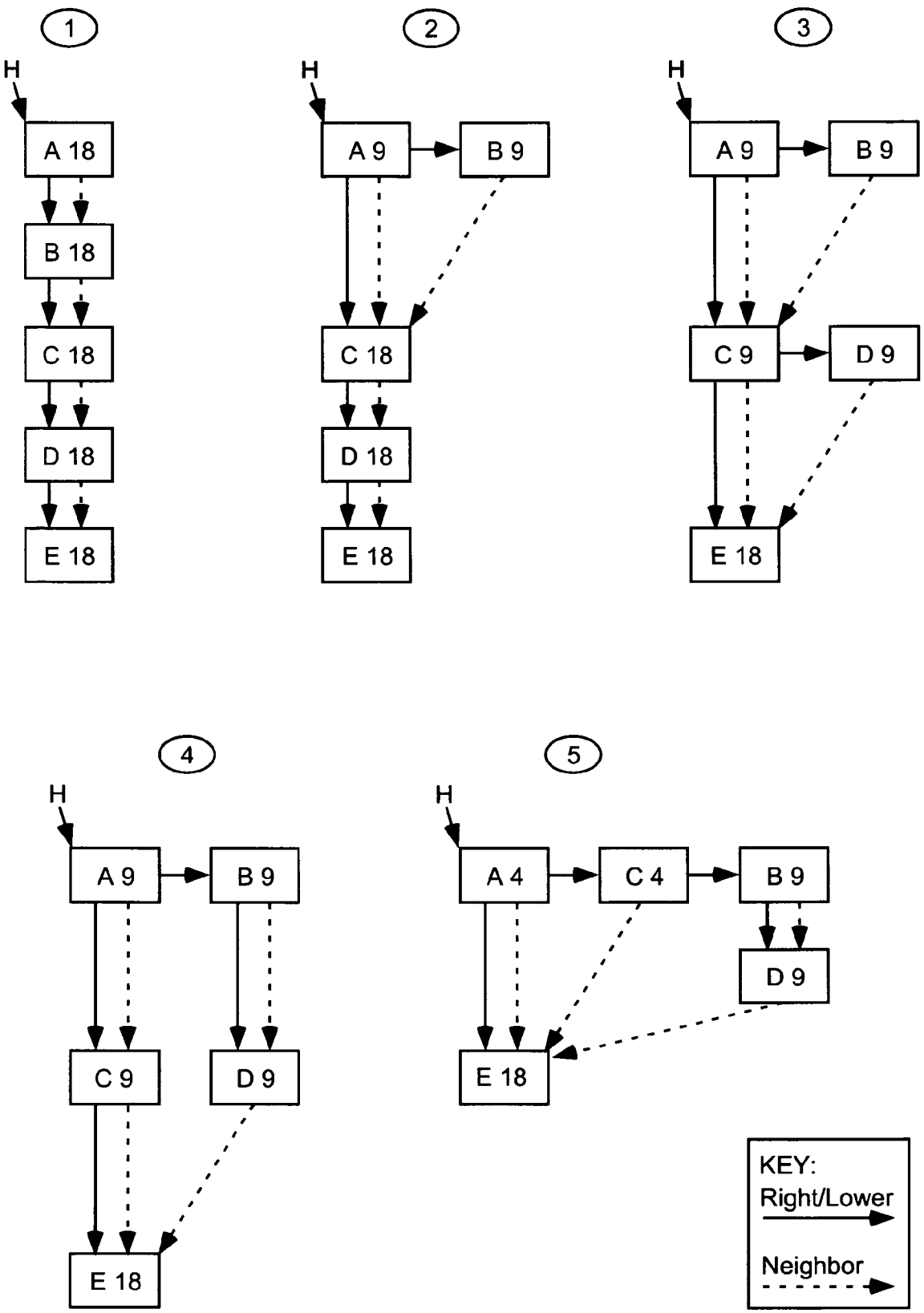
FIG. 17 illustrates a second exemplary modification of a column-based design to reduce multiplexing.

FIG. 17 illustrates a second exemplary modification of a column-based design to reduce multiplexing. The optimization steps 1-5 shown in FIG. 17 modify a 17×5 k column-based solution (five 18×1 k primitives cascaded in depth, as shown in FIG. 18) to produce an optimized memory. Note that the mechanism of keeping track of unused bits is not specifically shown in FIG. 17.

Step 1 shows the result of placing the column-based solution of FIG. 18 into tree form.

Step 2 shows the result after nodes A and B are optimized by a primitive replacement, as described above.

Step 3 shows the result when the optimization process is recursively performed on node A's lower pointer. In the resulting tree structure, nodes C and D are optimized in the same fashion as nodes A and B were previously optimized. The optimization process is then recursively performed on C's lower pointer. E cannot be optimized, so the optimization process is complete.

After all the recursive steps have been performed (e.g., after steps 2 and 3 are complete), the resulting tree is optimized, as shown in step 4. This step has the advantage of recolumnizing the solution to find further optimization opportunities.

The optimization process is then performed again to check for any additional optimizations. Nodes A and C could indeed be optimized, and the result is shown in step 5. A recursive call is then made on node A's lower pointer and node C's new right pointer. The recursive call on A's lower pointer checks to see if node E can be optimized. The recursive call on C's right pointer checks to see if nodes B and D can be optimized. However, the unused bits array indicates that all available bits were used to perform the optimization of nodes A and C.

The final step is to traverse the tree and record the primitive associated with each node into a return array. As the tree is traversed, the current width and depth are known for every tree and sub-tree. Therefore, any primitives lying outside the desired memory space can be detected. If a primitive is found that lies outside the desired memory space, the primitive is ignored, i.e., is not included in the return array. Thus, the design implementation that results from the optimization process may be smaller (may include fewer primitives) than the column-based solution that was the starting point of the optimization.

Figure 19:
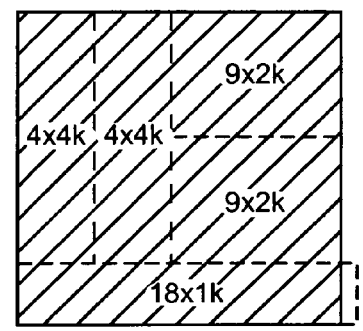
FIG. 19 illustrates a physical representation of a memory resulting from the modifications of FIG. 17, as performed on the column-based solution of FIG. 18.

FIG. 19 shows the results of the optimization process illustrated in FIG. 17.

The optimization methods shown in FIGS. 16-19 are merely exemplary, and other methods can be used. For example, the same software can be used to optimize tree structures for more than one target PLD, and the supported target PLDs might have different memory primitives available. In one embodiment, one target PLD includes primitives having twice the depth of the primitives for the other supported PLDs. In this embodiment, the optimization process includes a step of looking for paired primitives that are the same and cascaded in depth. If this condition is found, one of the two primitives is deleted and the other primitive is replaced by one of the primitives having twice the depth of the original primitives.

In the exemplary optimization process illustrated in FIGS. 17-19, the initial solution is generated using a column-based approach. In fact, the initial solution shown in FIG. 16 is a fixed-primitive solution, a special case of the column-based approach. However, in some embodiments (not shown) the initial solution is generated using some other approach, and does not conform to the requirements of a column-based solution. As long as two primitives of the same type occur vertically adjacent to one another somewhere in the initial solution, and the other requirements for a valid replacement are met, the two vertically-adjacent primitives can be replaced by two horizontally-adjacent primitives, with a concomitant reduction in output multiplexing requirements.

It will be apparent to those of skill in the art that the present invention can be practiced within these and other variations.

Note that the optimization methods illustrated in FIGS. 16-18 would be difficult or perhaps even impossible to implement in a known hardware description language (HDL) such as Verilog or VHDL. Therefore, the aspect of the invention in which the optimization process is implemented in a high-level language (HLL) such as C or C++ provides an improvement over known methods, in which the entire process is specified in an HDL.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Accordingly, all such modifications and additions are deemed to be within the scope of the invention, which is to be limited only by the appended claims and their equivalents. Trademarks are the property of their respective owners.

What is claimed is:

1. A computer-implemented method of mapping a logical representation of a memory to a physical representation of the memory, the method comprising:
inputting the logical representation of the memory;
generating a column-based solution for the memory, wherein the column-based solution comprises a plurality of primitives arranged such that each column includes only one type of the primitives, and wherein the column-based solution comprises a minimum number of the primitives attainable by the column-based approach;
wherein a first type of the primitives has a respective first width and first depth;
wherein the column-based solution is represented in a memory of the computer;
modifying the column-based solution to reduce multiplexing, wherein the physical representation of the memory is generated;
wherein the modifying includes replacing at least two first type primitives that are cascaded in depth in a first column with two or more primitives cascaded in width across two or more columns, wherein the two or more primitives cascaded in width have respective widths and respective depths, each respective width is less than each first width of each of the at least two first type primitives, and each respective depth is greater than each first depth of each of the at least two first type primitives; and
outputting the physical representation of the memory.

2. The method of claim 1, wherein a total number of the primitives in the physical representation is less than the minimum number of the primitives attainable by a column-based approach.

3. The method of claim 1, wherein the modifying comprises putting the column-based solution into a tree structure and optimizing the tree structure.

4. The method of claim 1, further comprising utilizing the physical representation of the memory to create an implementation of the memory targeted to a programmable logic device (PLD).

5. The method of claim 4, wherein each of the primitives comprises a programmable configuration of a RAM (random access memory) block in the PLD.

6. The method of claim 1, wherein the generating and the modifying are both performed by computer code implemented in a high level language (HLL).

7. The method of claim 1, wherein performance of the physical representation of the memory is improved relative to performance of the column-based solution.

8. A computer-implemented method of mapping a logical representation of a memory to a physical representation of the memory, the method comprising:
inputting the logical representation of the memory;
generating an initial solution for the memory;
wherein the initial solution includes a plurality of primitives arranged such that at least one column includes at least two adjacent primitives of a first type of the primitives, and the first type of the primitives has a respective first width and first depth;
wherein the initial solution is represented in a memory of the computer;
modifying the initial solution to reduce multiplexing by replacing pairs of first primitives cascaded in depth with pairs of second primitives cascaded in width, wherein the physical representation of the memory is generated;
wherein one of the pairs of first primitives include the at least two adjacent primitives of the first type, the pair of second primitives cascaded in width that replaced the adjacent primitives of the one pair have respective widths and respective depths, each respective width is less than each first width of each of the at least two adjacent primitives and each respective death is greater than each first death of each of the at least two adjacent primitives; and
outputting the physical representation of the memory.

9. The method of claim 8, wherein the modifying further comprising removing unneeded primitives wherein a total number of primitives in the physical representation is less than a number of primitives in the initial solution.

10. The method of claim 8, wherein the modifying comprises putting the initial solution into a tree structure and optimizing the tree structure.

11. The method of claim 8, further comprising utilizing the physical representation of the memory to create an implementation of the memory targeted to a programmable logic device (PLD).

12. The method of claim 11, wherein each of the primitives comprises a programmable configuration of a RAM (random access memory) block in the PLD.

13. The method of claim 8, wherein the generating and the modifying are both performed by computer code implemented in a high level language (HLL).

14. The method of claim 13, wherein the HLL comprises C++.

15. An article of manufacture, comprising:
a computer-readable storage medium comprising computer-executable code for mapping a logical representation of a memory to a physical representation of the memory, the medium comprising:
code for inputting the logical representation of the memory;
code for generating an initial solution for the memory;
wherein the initial solution includes a plurality of primitives arranged such that at least one column includes at least two adjacent primitives of a first type of the primitives, and the first type of the primitives has a respective first width and first depth;
wherein the initial solution is represented in a memory of the computer;
code for modifying the initial solution to reduce multiplexing by replacing pairs of first primitives cascaded in depth with pairs of second primitives cascaded in width, wherein the physical representation of the memory is generated;
wherein one of the pairs of first primitives include the at least two adjacent primitives of the first type, the pair of second primitives cascaded in width that replaced the adjacent primitives of the one pair have respective widths and respective depths, each respective width is less than each first width of each of the at least two adjacent primitives, and each respective depth is greater than each first depth of each of the at least two adjacent primitives; and
code for outputting the physical representation of the memory.

16. The article of manufacture of claim 15, wherein the code for generating an initial solution comprises code for following a column-based approach to generate a column-based initial solution.

17. The article of manufacture of claim 15, wherein the code for modifying comprises code for putting the initial solution into a tree structure and optimizing the tree structure.

* * * * *